United States Patent
Hedler et al.

(10) Patent No.: US 7,217,646 B2
(45) Date of Patent: May 15, 2007

(54) METHOD FOR CONNECTING AN INTEGRATED CIRCUIT TO A SUBSTRATE AND CORRESPONDING CIRCUIT ARRANGEMENT

(75) Inventors: Harry Hedler, Germering (DE); Thorsten Meyer, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/153,510

(22) Filed: Jun. 15, 2005

(65) Prior Publication Data
US 2005/0285152 A1   Dec. 29, 2005

(30) Foreign Application Priority Data
Jun. 25, 2004   (DE) .................. 10 2004 030 813

(51) Int. Cl.
*H01L 21/44* (2006.01)
(52) U.S. Cl. ..................... 438/612; 438/613
(58) Field of Classification Search .......... 438/612, 438/613; 257/E23.021
See application file for complete search history.

(56) References Cited

U.S. PATENT DOCUMENTS

| 5,250,469 | A | 10/1993 | Tanaka et al. |
| 6,881,611 | B1 * | 4/2005 | Fukasawa et al. ........... 438/114 |
| 2002/0158110 | A1 * | 10/2002 | Caletka et al. ......... 228/180.22 |
| 2003/0003779 | A1 * | 1/2003 | Rathburn .................... 439/66 |
| 2004/0012080 | A1 | 1/2004 | Hedler et al. |

(Continued)

FOREIGN PATENT DOCUMENTS

DE   WO 01/75969   10/2001

(Continued)

OTHER PUBLICATIONS

German Office Action dated Feb. 4, 2005.

(Continued)

*Primary Examiner*—Thao P. Le
(74) *Attorney, Agent, or Firm*—Jenkins, Wilson, Taylor & Hunt, P.A.

(57) ABSTRACT

Method for connecting an integrated circuit to a substrate and corresponding circuit arrangement The present invention provides a method for connecting an integrated circuit (C1), in particular a chip or a wafer or a hybrid, to a substrate (C2), which has the following steps: provision of a first electrical contact structure (KF1, BP, LB; KF1, BP') on a first main area (HF1) of the integrated circuit (C1); provision of a corresponding second electrical contact structure (KF2) on a second main area (HF2) of the substrate (C2); at least one of the contact structures, the first electrical contact structure (KF1, BP, LB; KF1, BP') or the second electrical contact structure (KF2), being elastic; placement of the first electrical contact structure (KF1, BP, LB; KF1, BP') onto the corresponding second electrical contact structure (KF2), so that both are in electrical contact and under mechanical compression pressure (P); and connection of a region of the main area (HF1) surrounding the first electrical contact structure (KF1, BP, LB; KF1, BP') to a corresponding region surrounding the second electrical contact structure (KF2) of the second main area (HF2) by an adhesive layer (KS), so that the first electrical contact structure (KF1, BP, LB; KF1, BP') and/or the second electrical contact structure (KF2) are compressed in the connected state. The invention likewise provides a corresponding circuit arrangement.

10 Claims, 4 Drawing Sheets

U.S. PATENT DOCUMENTS

2005/0067689 A1* 3/2005 Hedler et al. ............... 257/706
2005/0120553 A1* 6/2005 Brown et al. ................. 29/884
2005/0233609 A1* 10/2005 Rathburn ..................... 439/66
2005/0242434 A1* 11/2005 Boggs et al. ............... 257/737
2006/0005986 A1* 1/2006 Alcoe ........................ 174/52.1

FOREIGN PATENT DOCUMENTS

| DE | 10223738 | 12/2003 | |
|----|----------|---------|---|
| JP | 0321239  | 6/1989  | |
| JP | 4191065  | 6/1992  | |
| WO | WO 98/38676 | * | 9/1998 |

OTHER PUBLICATIONS

German Office Action dated Oct. 11, 2005.

* cited by examiner

METHOD FOR CONNECTING AN INTEGRATED CIRCUIT TO A SUBSTRATE AND CORRESPONDING CIRCUIT ARRANGEMENT

CROSS-REFERENCE TO RELATED APPLICATION

This application claims the benefit of Germany Patent Application No. 102004030813.6, filed Jun. 25, 2004, the contents of which are hereby incorporated herein by reference in their entirety.

1. Technical Field

The present invention relates to a method for connecting an integrated circuit to a substrate and relates to a corresponding circuit arrangement.

2. Background Art

Although it can in principle be applied to any desired integrated circuits, the present invention and the problems on which it is based are explained with respect to chips with integrated circuits in silicon technology.

The classic solution for connecting an integrated circuit to a substrate provides wire bonds, which have a high space requirement.

CSP (chip size package) or WLP (wafer level package) solutions for connecting an integrated circuit to a substrate have problems with respect to reliability when there are temperature changes, in particular in the case of large chips.

In the case of chip size packages and wafer level packages, essentially two types of connecting structures between the chip and the substrate are so far known.

A customary solution for connecting an integrated circuit to a substrate is the use of ball grid arrays with rigid solder balls or bumps for the mechanical connection, if appropriate with additional use of an underfill to increase the stability.

In the case of this customary solution, the mismatch of the thermal properties of the chip and the substrate, in particular the coefficient of thermal expansion, leads to greater risks in terms of reliability. The solder balls can be sheared off when there are changes in temperature. In particular in the case of large chips, this limits the reliability considerably.

Yet a further solution for connecting an integrated circuit to a substrate is the use of elastic elevations. WO 00/79589 A1 discloses an electronic component which has flexible elevations of an insulating material on one surface, an electrical contact being arranged on the flexible elevation and a conduction path being arranged on the surface or in the interior of the flexible elevation between the electrical contact and the electronic circuit. The advantage of this solution is a lower height of its construction, greater reliability and lower costs. It is known in this connection to solder or adhesively bond the elastic contact elements onto the substrate. Both groups share the common feature that the contact elements of the chip are firmly connected to the contact elements of the substrate either by solder or by a conductive adhesive.

Further disadvantages of the known solutions are the high space requirement, the high radio-frequency impedances and also a lack of suitability for direct chip/chip or chip/substrate contact.

SUMMARY OF THE INVENTION

An object of the present invention is to provide a more simple and low-cost method for connecting an integrated circuit to a substrate and a corresponding circuit arrangement, which method remains largely uninfluenced by thermal mismatch and ensures a reliable electrical contact.

This object is achieved according to the invention by the method for connecting an integrated circuit to a substrate according to claim 1 and the corresponding circuit arrangement according to claim 11.

The idea on which the present invention is based is to use a contact system in which the ends of the contact elements of the integrated circuit and the substrate are placed one on top of the other and are at the same time under a specific frozen-in compression pressure.

In this case, the electrical contact structure of the integrated circuit and/or the electrical contact structure of the substrate may have elastic elevations.

The contact surfaces of the contact structures on both sides should be of such a nature that they are stable in the long term with regard to the pressure contact and have good electrical functionality. It must also be ensured that the material of the elastic elevations retains the desired elasticity in the entire application range.

The elastic contact structure provided according to the invention makes it possible to compensate for differences in the linear expansion in the connecting plane that exist between the elements involved, and also to achieve a reliable electrical contact between the elements involved in the direction of compression. In the case of such connections, a mechanical connection and an electrical contact can be advantageously produced in one working step.

Advantageous developments and improvements of the respective subject matter of the invention can be found in the subclaims.

According to a preferred development, the first electrical contact structure has a contact area on the first main area of the integrated circuit, a nonconducting elastic elevation and an interconnect connecting the upper side of the nonconducting elastic elevation to the contact area.

According to a further preferred development, the first electrical contact structure has a contact area on the first main area of the integrated circuit and a conducting elastic elevation.

According to a further preferred development, the region of the main area surrounding the first electrical contact structure is covered by a covering layer and the adhesive layer is provided on the covering layer.

According to a further preferred development, the covering layer partly overlaps the contact area on the first main area of the integrated circuit in its periphery.

According to a further preferred development, the substrate is a further integrated circuit, in particular a chip or a wafer or a hybrid.

According to a further preferred development, the region of the main area surrounding the second electrical contact structure is covered by a further covering layer and the adhesive layer is provided on the further covering layer.

According to a further preferred development, the second electrical contact structure has a further contact area and the further covering layer partly overlaps the further contact area on the second main area of the substrate in its periphery.

According to a further preferred development, the first electrical contact structure and the corresponding electrical contact area are connected to each other, preferably by soldering or conductive adhesive bonding.

According to a further preferred development, the adhesive layer has such an elasticity that, when there is different thermal expansion of the substrate and the integrated circuit, it makes it possible for them to be displaced with respect to each other in the common plane of the first and second main areas.

Exemplary embodiments of the invention are explained in more detail in the description which follows and are represented in the drawings, in which:

DETAILED DESCRIPTION OF THE INVENTION

Figure 1A:
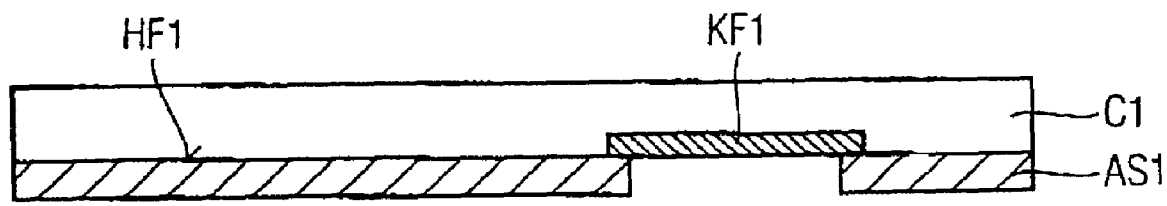
FIGS. 1a–1d show schematic representations of a method for connecting an integrated circuit to a substrate according to a first embodiment of the present invention.

In the figures, the same reference numerals designate components that are the same or functionally the same.

Without restricting generality, in the case of the two exemplary embodiments that are explained below the substrate is an integrated circuit in chip form.

FIGS. 1a,b are schematic representations of a method for connecting an integrated circuit to a substrate according to a first embodiment of the present invention.

In FIG. 1a, reference numeral C1 designates a first integrated circuit in chip form, which has a first contact area KF1 in a main area HF1. The main area HF1 also has a covering layer AS1 of polyimide, which covers the main area HF1 surrounding the contact area and overlaps the periphery of the contact area KF1.

Figure 1B:
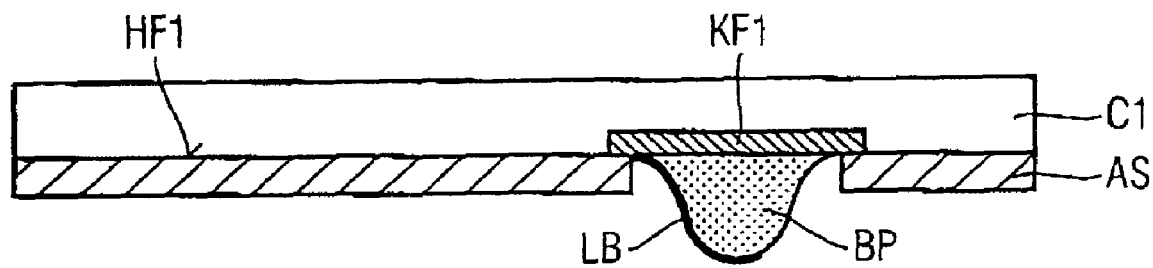

In a further method step, which is illustrated in FIG. 1b, a nonconducting elastic elevation BP is provided on the contact area KF1 and its upper side is connected to the contact area KF1 by means of an interconnect LB. Preferred technologies for producing the elastic elevation BP are printing technology, dispensing, ink-jetting, spin-coating, spraying or photolithography. In particular in the case of a nonconductive elastic elevation BP, the interconnect LB may be realized by partial metallization by means of sputtering, electroless plating or electroplating.

Figure 1C:
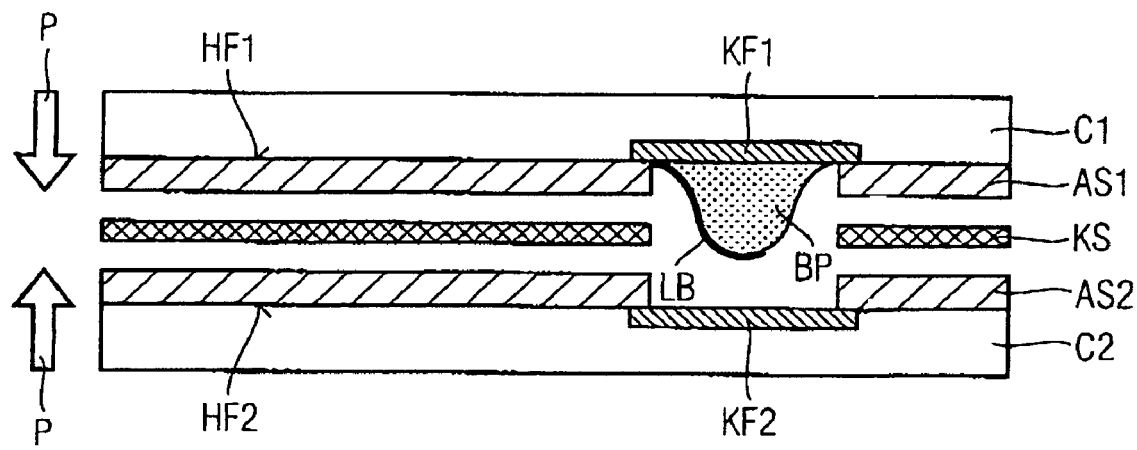

Furthermore, with respect to FIG. 1c, a second integrated circuit C2 is provided in chip form, which circuit has a corresponding second contact area KF2 on a main area HF2. The second main area HF2 is also covered in the periphery of the contact area KF2 by a second covering layer AS2 of polyimide, which overlaps the periphery of the contact area KF2. Au/Au contact surfaces are preferred for the contact areas KF1, KF2 and the interconnect LB.

In a further process step, an adhesive layer KS is provided between the two integrated circuits C1, C2, to be precise in the region where the covering layers AS1 and AS2 are present, that is in the overlapping region and in the surrounding region of the contact areas KF1, KF2. The adhesive layer KS is preferably applied to one of the two covering layers AS1 or AS2, for example by dispensing.

Figure 1D:
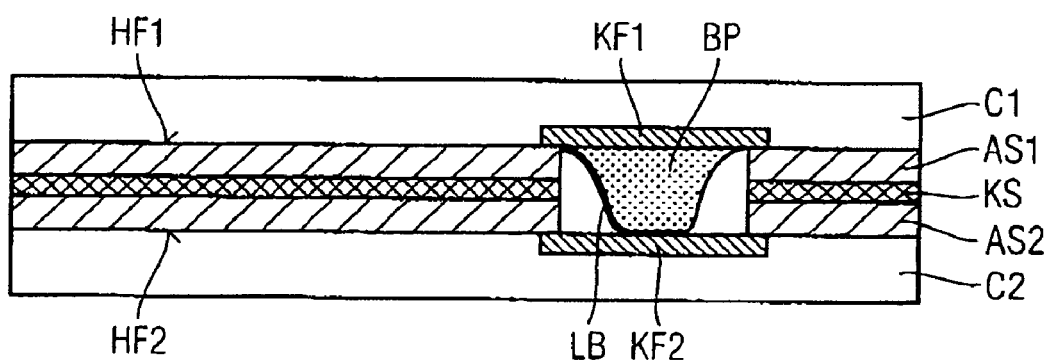

Following this, compression pressure P is applied to the areas of the integrated circuits C1, C2 lying opposite the main areas HF1, HF2 and the adhesive layer KS is made to set. This leads to the state shown in FIG. 1d, according to which the elastic elevation BP with the interconnect LB located on it is compressed and pressed onto the contact area KF2, in order to make a stable electrical contact possible.

Figure 2A:
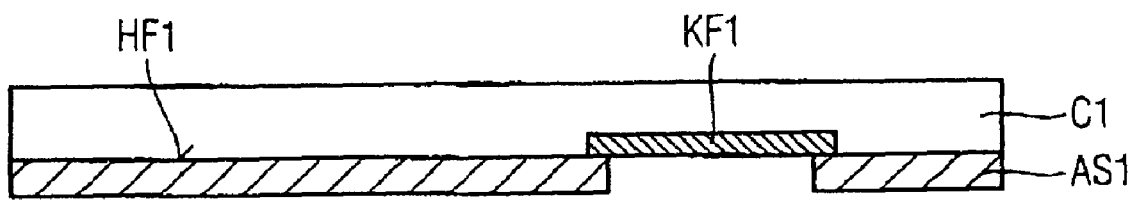
FIGS. 2a–2d show schematic representations of a method for connecting an integrated circuit to a substrate according to a second embodiment of the present invention.
Figure 2B:
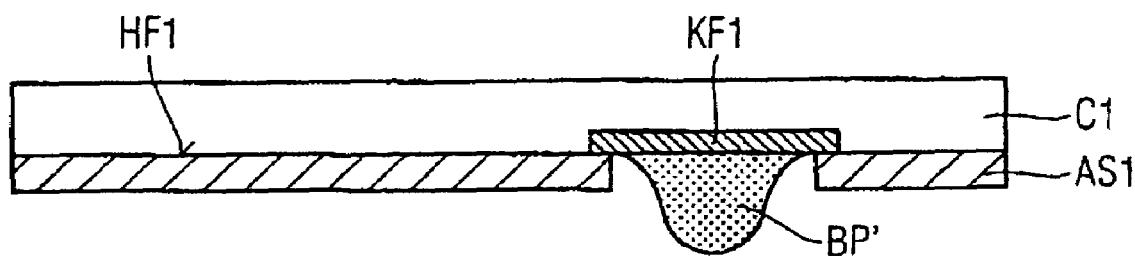
Figure 2C:
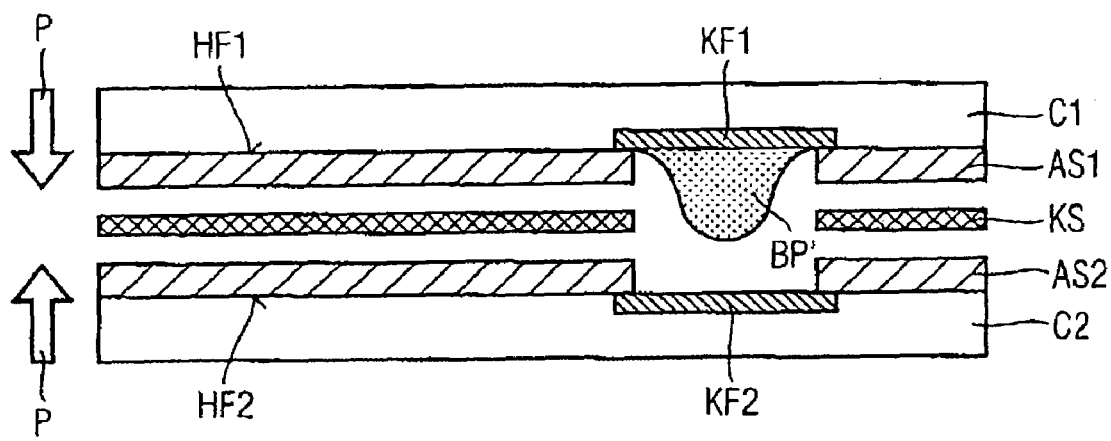
Figure 2D:
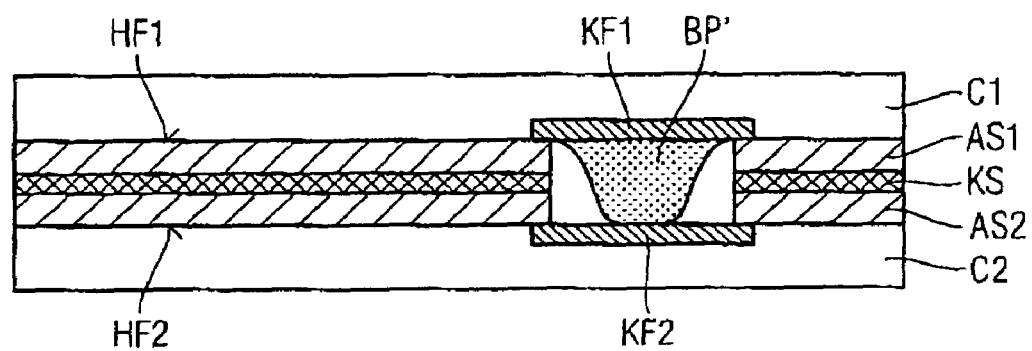

FIGS. 2a,b are schematic representations of a method for connecting an integrated circuit to a substrate according to a second embodiment of the present invention.

The second exemplary embodiment, described in FIGS. 2a–d, differs from the first exemplary embodiment described above only in that the elastic elevation BP' is conductive, that is to say the interconnect LB can be omitted. This conductivity is achieved for example by admixing a conductive component with the elastic plastic.

Although the present invention has been described above on the basis of a preferred exemplary embodiment, it is not restricted to this but can be modified in a wide variety of ways.

The present invention can in particular be applied not only to chips but also to hybrids, wafers or other integrated circuits.

It goes without saying that the substrate could, however, also be a printed circuit board or some other substrate. In the case of the mounting of a chip, which is produced for example from silicon, as the first integrated circuit on a substrate, which is produced for example from a plastic, the adhesive bond by means of the adhesive layer KS acts as compensation with respect to different linear expansions in the connecting plane. Similarly, the elastic property of the contact structure has the effect that no bending or slipping of the contact can take place, and consequently a secure electrical connection is retained even under thermal loading.

The connecting of the first and second integrated circuits C1, C2 preferably takes place by ironing, the adhesive of the adhesive layer KS that is inserted between the two elements involved in the connection setting and the elastic contact freezing in under prestress.

Although in the exemplary embodiments the connection between the interconnect LB and the contact area KF2 is only a pressure connection, it goes without saying that this connection may be reinforced by soldering or conductive adhesive bonding. In this case, the covering layer AS1 or AS2 advantageously acts as a solder stop or conductive adhesive stop.

List of Reference Numerals
C1 integrated circuit
C2 integrated circuit, substrate
HF1, HF2 first, second main area
AS1, AS2 covering layer
KS adhesive layer
KF1, KF2 contact area
BP, BP' elastic elevation
LB interconnect
P compression pressure

What is claimed is:

1. Method for connecting an integrated circuit, in particular a chip or a wafer or a hybrid, to a substrate, which has the following steps:
   (a) providing of a first electrical contact structure on a first main area of the integrated circuit;
   (b) providing of a corresponding second electrical contact structure on a second main area of the substrate;
   (c) at least one of the contact structures, the first electrical contact structure or the second electrical contact structure, being elastic;
   (d) placing of the first electrical contact structure onto the corresponding second electrical contact structure, so that both are in electrical contact and under mechanical compression pressure; and
   (e) connecting of a region of the main area surrounding the first electrical contact structure to a corresponding region surrounding the second electrical contact structure of the second main area by an adhesive layer, so that the first electrical contact structure and/or the second electrical contact structure are compressed in the connected state; a region of the adhesive layer is recessed in a region around the elastic one of the first contact structure and the second contact structure such that spacing is provided between the adhesive layer and the elastic one of the first contact structure and the second contact structure.

2. Method according to claim 1, wherein the first electrical contact structure has a contact area on the first main area of the integrated circuit, a nonconducting elastic elevation and an interconnect connecting the upper side of the nonconducting elastic elevation to the contact area.

3. Method according to claim 1, wherein the first electrical contact structure has a contact area on the first main area of the integrated circuit and a conducting elastic elevation.

4. Method according to claim 1, wherein the region of the main area surrounding the first electrical contact structure is covered by a covering layer and the adhesive layer is provided on the covering layer.

5. Method according to claim 4, wherein the covering layer partly overlaps the contact area on the first main area of the integrated circuit in its periphery.

6. Method according to claim 1, wherein the substrate is a further integrated circuit, in particular a chip or a wafer or a hybrid.

7. Method according to claim 6, wherein the region of the main area surrounding the second electrical contact structure is covered by a further covering layer and the adhesive layer is provided on the further covering layer.

8. Method according to claim 7, wherein the second electrical contact structure has a further contact area and the further covering layer partly overlaps the further contact area on the second main area of the substrate in its periphery.

9. Method according to claim 1, wherein the first electrical contact structure and the corresponding electrical contact area are connected to each other, preferably by soldering or conductive adhesive bonding.

10. Method according to claim 1, wherein the adhesive layer has such an elasticity that, when there is different thermal expansion of the substrate and the integrated circuit, it makes it possible for them to be displaced with respect to each other in the common plane of the first and second main areas.

* * * * *